United States Patent
Yu et al.

(10) Patent No.: US 8,278,820 B2
(45) Date of Patent: Oct. 2, 2012

(54) ACTIVE MATRIX ORGANIC ELECTROLUMINESCENT DEVICE AND METHOD OF MANUFACTURE THEREOF

(75) Inventors: Junsheng Yu, Chengdu (CN); Yadong Jiang, Chengdu (CN); Jian Zhong, Chengdu (CN); Hui Lin, Chengdu (CN)

(73) Assignee: University of Electric Sience and Technology of China, Chengdu, Sichuan Province (CN)

( * ) Notice: Subject to any disclaimer, the term of this patent is extended or adjusted under 35 U.S.C. 154(b) by 104 days.

(21) Appl. No.: 12/770,726

(22) Filed: Apr. 30, 2010

(65) Prior Publication Data

US 2011/0221331 A1   Sep. 15, 2011

(30) Foreign Application Priority Data

Mar. 9, 2010  (CN) .......................... 2010 1 0120806

(51) Int. Cl.
   *H01L 51/52*  (2006.01)
(52) U.S. Cl. ......... 313/504; 313/512; 313/506; 313/509
(58) Field of Classification Search ................ 257/40, 257/72, 98–100, 642–643, 759; 313/498–512; 315/169.1, 169.3; 427/58, 64, 66, 532–535, 427/539; 428/690–691, 917, 690–1; 438/26–29, 438/34, 82, 455; 445/24–25
See application file for complete search history.

(56) References Cited

U.S. PATENT DOCUMENTS

2009/0195155 A1*  8/2009  Tsuchiya ..................... 313/506
* cited by examiner

*Primary Examiner* — Mariceli Santiago
*Assistant Examiner* — Donald Raleigh

(57) ABSTRACT

An active matrix organic electroluminescent device includes a thin-film transistor, an organic electroluminescent device, and a spacer layer deposited between the thin-film transistor and the organic electroluminescent device, wherein the spacer layer is made of adhesive for a dual curing system selected from the group consisting of ultraviolet curing-thermal curing, ultraviolet curing-microwave curing, ultraviolet curing-anaerobic curing, and ultraviolet curing-electron beam curing system. The present invention solves the poor adhesiveness between the thin-film transistor and the organic electroluminescent device, and improves the moisture and oxygen proof ability. The preparation method is simple, effective, and able to lower the cost and difficulty, and greatly improve the yield rate of the device.

4 Claims, 1 Drawing Sheet

ACTIVE MATRIX ORGANIC ELECTROLUMINESCENT DEVICE AND METHOD OF MANUFACTURE THEREOF

BACKGROUND OF THE PRESENT INVENTION

1. Field of Invention

The present invention relates to an organic optoelectronic device technology, and more particularly to an active matrix organic electroluminescent device and method of manufacture thereof.

2. Description of Related Arts

Optoelectronic technology is a rapid developing high-tech emerging industry after microelectronic technology. With the rapid development of optoelectronic technology, its related devices such as solar cells, optical imaging sensors, plasma display panels, electroluminescent displays, thin-film transistors, liquid crystal display panels and so on, have gradually developed, which greatly improve the people's living standard and quality of life. At the same time, the wide application of the optoelectronic information technology in various fields of social life also creates a growing market. Nowadays, the optoelectronic information industry has been regarded as one of the key development fields in strategic planning of the western developed countries. Therefore, the competition of optoelectronic information field is being fiercely launched throughout the world.

The organic functional materials widely used in the optoelectronic devices have played a contributory role in the development of optoelectronic technology. Since Dr. C. W. Tang and coworkers in the U.S. Kodak company invented an organic electroluminescent device with thin-film sandwich structure in 1987, based on summing up the experiences of our predecessors, the organic optoelectronic devices had entered the period of unprecedented rapid development, and its related organic functional materials had been widely used in optoelectronic detection, solar cells, displays and so on. By using the organic materials, the production costs of optoelectronic devices will be greatly reduced, and the performances thereof will be greatly improved.

Conventionally, in order to obtain an active matrix organic electroluminescent device with a good adhesion, the photoresist deposition and other methods are used for the insulation treatment between an active matrix driving circuit and an organic electroluminescent device. These methods need special equipments and are difficult to operate, which result in high cost. On the other hand, for an active matrix organic electroluminescent device made by a traditional method, the binding force between the organic electroluminescent device and the active matrix driving circuit is lower, so the organic electroluminescent device easily falls off from the active matrix driving circuit.

SUMMARY OF THE PRESENT INVENTION

An object of the present invention is to provide an active matrix organic electroluminescent device and a method of manufacture thereof, which solve the poor adhesiveness between the driving circuit and the organic electroluminescent device due to the low surface energy of the thin-film transistor, and improve the ability to proof moisture and oxygen. The preparation method is simple, effective, and able to lower the cost and difficulty, and greatly improves the yield rate of the devices.

Accordingly, in order to accomplish the above object, the present invention provides an active matrix organic electroluminescent device comprising a thin-film transistor, an organic electroluminescent device, and a spacer layer deposited between the thin-film transistor and the organic electroluminescent device, wherein the spacer layer is made up of a dual curing system which is achieved by two independent curing stages, one is an ultraviolet curing reaction, the other is a dark reaction, wherein the dual curing system is a curing system selected from the group consisting of an ultraviolet curing-thermal curing system, an ultraviolet curing-microwave curing system, an ultraviolet curing-anaerobic curing system and an ultraviolet curing-electron beam curing system.

In the active matrix organic electroluminescent device of the present invention, the dual-curing system is a curing system selected from the group consisting of:

(1) a free radical ultraviolet curing-thermal curing system made of a material comprising:
- 30~40% unsaturated polyester resin or acrylic resin or polymercaptan-polyene;
- 35~45% epoxy resin or isocyanate or amino resin or free radical thermal curing agent;
- 0.2~3% styrene and its derivatives or single functional or multifunctional acrylic acid;
- 0.1~3% photoinitiator; and
- 0.2~6% photosensitizer and additive,
- wherein the curing process is: firstly ultraviolet curing, then heat curing, and lastly ultraviolet curing; or firstly heat curing, then ultraviolet curing, and lastly heat curing;

(2) a free radical ultraviolet curing-microwave curing system made of a material comprising:
- 30~40% unsaturated polyester resin or acrylic resin or polymercaptan-polyene;
- 35~45% epoxy resin or isocyanate or amino resin or free radical thermal curing agent;
- 0.2~3% styrene and its derivatives or single functional or multifunctional acrylic acid;
- 0.1~3% photoinitiator; and
- 0.2~6% photosensitizer and additive,
- wherein the curing process is: firstly ultraviolet curing, then microwave curing, and lastly ultraviolet curing; or firstly microwave curing, then ultraviolet curing, and lastly heat or microwave curing;

(3) a free radical ultraviolet curing-anaerobic curing system made of a material comprising:
- 55~65% unsaturated polyester resin or acrylic resin or polymercaptan-polyene;
- 20~30% dimethacrylate polyol ester or bisphenol-A epoxy polyol ester;
- 0.2~3% styrene and its derivatives or single functional or multifunctional acrylic acid;
- 0.1~3% photoinitiator; and
- 0.2~6% photosensitizer and additive,
- wherein the curing process is: firstly ultraviolet curing, then automatically anaerobic curing the adhesive without illumination and under hypoxic condition, and lastly ultraviolet curing;

(4) a free radical ultraviolet curing-electron beam curing system made of a material comprising:
- 35~40% unsaturated polyester resin or acrylic resin or polymercaptan-polyene;
- 50~55% bisphenol-A vinyl ester resin;
- 0.2~3% styrene and its derivatives or single functional or multifunctional acrylic acid;
- 0.1~3% photoinitiator; and
- 0.2~6% photosensitizer and additive,
- wherein the curing process is: firstly ultraviolet curing, then electron beam curing in the vacuum, and lastly ultraviolet curing;

(5) a cationic ultraviolet curing-thermal curing system made of a material comprising:
  35~45% epoxy resin or modified epoxy resin;
  40~45% epoxy resin or isocyanate or amino resin or free radical thermal curing agent;
  4.0~9% diluting agent;
  1.2~3% cationic photoinitiator; and
  0.2~3% photosensitizer and additive,
  wherein the curing process is: firstly ultraviolet curing, then heat curing, and lastly ultraviolet curing; or firstly heat curing, then ultraviolet curing, and lastly heat curing;
(6) a cationic ultraviolet curing-microwave curing system made of a material comprising:
  35~45% epoxy resin or modified epoxy resin;
  40~45% epoxy resin or isocyanate or amino resin or free radical thermal curing agent;
  4.0~9% diluting agent;
  1.2~3% cationic photoinitiator; and
  0.2~3% photosensitizer and additive,
  wherein the curing process is: firstly ultraviolet curing, then microwave curing, and lastly ultraviolet curing; or firstly microwave curing, then ultraviolet curing, and lastly heat or microwave curing;
(7) a cationic ultraviolet curing-anaerobic curing system made of a material comprising:
  60~65% epoxy resin or modified epoxy resin;
  25~30% dimethacrylate polyol ester or bisphenol-A epoxy polyol ester;
  0.4~9% diluting agent;
  0.1~3% cationic photoinitiator; and
  0.2~3% photosensitizer and additive,
  wherein the curing process is: firstly ultraviolet curing, then automatically anaerobic curing the adhesive without illumination and under hypoxic condition, and lastly ultraviolet curing; and
(8) a cationic ultraviolet curing-electron beam curing system made of a material comprising:
  30~35% epoxy resin or modified epoxy resin;
  50~55% bisphenol-A vinyl ester resin;
  0.4~6% diluting agent;
  0.1~3% cationic photoinitiator; and
  0.2~3% photosensitizer and additive,
  wherein the curing process is: firstly ultraviolet curing, then electron beam curing in the vacuum, and lastly ultraviolet curing.

In the active matrix organic electroluminescent device of the present invention, the free radical thermal curing agent comprises: ethylenediamine, hexamethylene diamine, triethylenetetramine, hydroxyethyl diethylene triamine, hydroxyl isopropyl diethylenetriamine, poly ethane diacid adipamide, dimethyl amino propyl amine, tetramethyl propanediamine, dicyandiamide, diaminodiphenylsulfone, diaminodiphenyl methane, m-phenylenediamine, diethyltoluenediamine, N-(aminopropyl)-toluene diamine, dimethylethanolamine, dimethyl benzyl amine, triethyl benzyl amine chloride, benzyl-dimethylamine, N-dimethyl benzyl amine, 2,4,6,-tri-(dimethylaminomethyl)-phenol, phenol-formaldehyde-hexanediamine, N,N-dimethyl benzyl amine, 2-ethylimidazole, 2-phenylimidazole, 2-methylimidazole, 2-ethylimidazole, 2-ethyl-4-methylimidazole, 1-(2-aminoethyl)-2-methylimidazole, maleic anhydride, diphenyl ether tetracid dianhydride, phthalic anhydride, trimellitic anhydride, tetrabromophthalic anhydride, polyazelaic acetic anhydride, sebacic dihydrazide, adipic dihydrazide, carbonic dihydrazide, oxalyl dihydrazide, succinic dihydrazide, adipoyl hydrazide, N-amino polyacrylamide, sebacic hydrazide, isophthalic hydrazide, dihydroxy benzoic acid hydrazide, azelaic acid dihydrazide, isophthalic dihydrazide, ferrocene tetrafluoborate, triallyl cyanurate, toluene diisocyanate, diphenyl-methane-diisocyanate, hexamethylene diisocyanate, trimethyl-hexamethylene diisocyanate, dicyclohexylmethane diisocyanate, xylyl diisocyanate, tetramethyl xylyl diisocyanate, methylstyrene isocyanate, methylcyclohexane diisocyanate, triphenylmethyl-4,4',4'-triisocyanate, diaminobiphenyl methane, N-chlorophenyl-N—N-dimethylurea, 3-phenyl-1,1-dimethylurea, 3-chlorophenyl-1,1-dimethylurea, 4,4'-diaminodiphenyl bisphenol, polyurethane, urea-formaldehyde resin, epoxy-ethylenediamine carbamate, 2,4,6-tris(dimethylaminomethyl)phenol, 2,4-diaminotoluene, polyurethane, methylated urea formaldehyde resin, tris(3-aminopropyl)amine, 2-aminoethyl-bis(3-aminopropyl)amine, 4,4'-diamino diphenyl methane, 4,4'-diamino diphenyl bisphenol, 4,4'-diamino diphenyl sulfone, tris(3-aminopropyl)amine, melamine resin, benzoguanamine resin, hexamethylol melamine resin, hexamethoxy methyl melamine resin, urea-melamine formaldehyde resin, polyester melamine, trichloro-isocyanurate, amino triazine resin, urethane acrylate, 4-aminopyridine resin, N-β-aminoethyl amino-polyester resin, α-aminopyridine resin, amino diphenyl ether resin, phosphoramidic resin, hydroxyethyl amino polyester resin. The microwave curing adhesive and thermal curing adhesive can be made of the same or different material. The anaerobic curing adhesive comprises: tetraethylene glycol dimethacrylate, triethylene glycol bismethylacrylate, triethylene glycol di-methacrylate, glycol dimethacrylate, hydroxyethyl or hydroxypropyl methacrylate, methoxylated poly(ethylene glycol) methyl ether methacrylate, phthalic acid triethylene glycol ester, β-hydroxyethyl methacrylate, triethylene glycol dimethacrylate, dimethacryloyl-ethylthioether, phthalic bis(diethylene glycol acrylate), ethoxylated bisphenol A dimethacrylate, dimethyl acrylic bisphenol A ethylene glycol ester, ethylene methacrylic acid ester, triethylene glycol dimethacrylate, triethlene glycol bismethylacrylate, ethylene glycol bismethylacrylate, diethylene glycol bismethylacrylate, methacrylate epoxy resin, diethylene glycol dimethacrylate. The electron beam curing adhesive comprises: tri (4-hydroxyphenyl)methane glycidyl ether epoxy resin, dicyclopentadiene bisphenol epoxy resin, bisphenol A vinyl ester resin, epoxy vinyl ester resin, epoxy acrylic resin, maleimide resin, 4,4'-diphenylmethane bismaleimide, bisphenol A diphenyl ether bismaleimide, bisphenol A maleic ethenyl resin, brominated vinyl ester resin, phenolic epoxy ethenyl resin, hydroxymetyyl bisphenol A epoxy ether, bisphenol A acrylic ester, polyurethane-acrylate, bisphenol A epoxy vinyl ester resin, bisphenol A benzoxazine-epoxy resin, bisphenol fluorine epoxy resin, bisphenol A epoxy acrylic resin, bisphenol A diglycidyl ether, and bisphenol A epoxy chloric acrylic ester resin.

In the active matrix organic electroluminescent device of the present invention, the photoinitiator comprises benzoin and its derivates benzoin methyl ether, benzoin ethyl ether, acetyl benzene derivates and benzoin isopropyl ether. The cationic photoinitiator comprises aryl sulfonium salt, iodonium salt, and ferrocenium salt. The photo sensitizer comprises benzophenone, thia-anthraquinone and michler's ketone. The additive comprises plasticizer, thixotropic agent and filler.

In the active matrix organic electroluminescent device of the present invention, the plasticizer comprises: phthalic acid bis-1-octyl ester, phthalic acid bis-butyl ester, tris(2-butoxyethyl) phosphate, polyvinyl butyral resin, acetyl tri-n-butyl citrate, dimethyl phthalate, diethyl phthalate, hexanedioic acid bis(butoxyethoxy)ethyl ester, tetraisopropyl titanate, tetrabutyl titanate, citric acid ester, 2-ethylhexyl trimellitate, phthalic acid bis-2-ethylhexyl ester, diisooctyl sebacate, diethylene glycol dibenzoate, phthalic anhydride, dipropylene glycol dibenzoate, and chlorosulfonated polyethylene. The coupling agent comprises vinyl methyldichloro silane, methyldichlorosilane, dimethyldichlorosilane, dimethylchlorosilane, vinyltrichloro silane, 3-aminopropyltrimethoxysilane, polydimethylsiloxane, polymethylhydrosiloxane, polymethylmethoxylsiloxane, 3-glycidoxypropyltrimethoxysilane, 3-aminopropyltriethoxysilane, γ-glycidicether propyl trimethoxysilane, aminopropyltriethyoxysilane, 3-glycidoxypropyltrimethoxysilane, dodecyl-trimethoxysilane, ethenyltriethyloxysilane, vinyltrimethoxysilane, 3-chloropropyltriethoxysilane, bis-(triethoxysilylpropyl), anilinomethyltriethoxysliane, N-(β-aminoethyl)-γ-aminopropyltrimethoxy silane, N-(β-Aminoethyl)-γ-aminopropyltriethoxy silane, N-(β-(aminoethyl))-γ-aminopropyl-methyldimethoxy silane, 3-methacryloxypropyltrimethoxysilane, γ-methacryloxypropyltrimethylsilane, (3-mercaptopropyl) trimethoxysilane, and 3-mercaptopropyltriethoxysilane.

A method of manufacturing an active matrix organic electroluminescent device comprises the steps of:

(1) preprocessing a substrate;
(2) preparing a thin-film transistor on the substrate;
(3) applying a spacer layer material onto a surface of the thin-film transistor forming a spacer layer, wherein the spacer layer material is made up of a dual curing system which is achieved by two independent curing stages, one is an ultraviolet curing reaction, the other is a dark reaction, wherein the dual curing system is a curing system selected from the group consisting of an ultraviolet curing-thermal curing system, an ultraviolet curing-microwave curing system, an ultraviolet curing-anaerobic curing system and an ultraviolet curing-electron beam curing system;
(4) curing the spacer layer by ultraviolet irradiation;
(5) thermal-curing the spacer layer in a heating furnace or microwave-curing the spacer layer in a microwave oven;
(6) photoetching the spacer layer forming a pattern thereon;
(7) preparing an organic electroluminescent device on the spacer layer;
(8) curing the spacer layer by ultraviolet irradiation again;
(9) packaging the active matrix organic electroluminescent device; and
(10) testing every photoelectric property and intrinsic parameter of the active matrix organic electroluminescent device, wherein steps (4) and (5) can be exchanged, that is to say, firstly heat curing or microwave curing, and then ultraviolet curing.

A method of manufacturing an active matrix organic electroluminescent device comprises the steps of:

(A) preprocessing a substrate;
(B) preparing a thin-film transistor on the substrate;
(C) applying a spacer layer material onto a surface of the thin-film transistor forming a spacer layer, wherein the spacer layer material is made up of a dual curing system which is achieved by two independent curing stages, one is an ultraviolet curing reaction, the other is a dark reaction, wherein the dual curing system is a curing system selected from the group consisting of an ultraviolet curing-thermal curing system, an ultraviolet curing-microwave curing system, an ultraviolet curing-anaerobic curing system and an ultraviolet curing-electron beam curing system;
(D) curing the spacer layer by ultraviolet irradiation;
(E) anaerobic-curing or electron beam-curing the spacer layer in a vacuum circumstance;
(F) photoetching the spacer layer forming a pattern thereon;
(G) preparing an organic electroluminescent device on the spacer layer;
(H) curing the spacer layer by ultraviolet irradiation again;
(I) packaging the active matrix organic electroluminescent device; and
(J) testing every photoelectric property and intrinsic parameter of the active matrix organic electroluminescent device, wherein steps (D) and (E) can be exchanged, that is to say, firstly anaerobic curing or electron beam curing, and then ultraviolet curing.

In steps (3) and (C), the spacer layer is directly prepared on the thin-film transistor, or is prepared by spin coating a diluted organic solvent on the thin-film transistor, wherein the spacer layer is deposited on the thin-film transistor by a method selected from the group consisting of vacuum coating, ionic cluster beam deposition, ion plating, DC sputtering film, RF sputtering film, ion beam sputtering film, ion beam assisted deposition, plasma enhanced chemical vapor deposition, high-density inductive couple plasma source chemical vapor deposition, catalytic chemical vapor deposition, megnetron sputtering, plating, spin coating, dip coating, inkjet printing, roller coating, and langmuir-blodgett film.

A method of manufacturing an active matrix organic electroluminescent device comprises the steps of:

(a) ultrasonically cleaning a substrate by detergent, acetone solution, ethanol solution and deionized water, and drying the substrate by blowing dry nitrogen thereto;
(b) preparing a thin-film transistor on the processed substrate;
(c) stirring a spacer layer material diluted by ethanol for 20 hours forming a mixture, wherein the spacer layer material: ethanol is 1:10, applying the mixture onto a surface of the thin-film transistor in a spinning manner for a minute forming a spacer layer, wherein the spinning rate is 2000~3000 rev/sec and the thickness of the spacer layer is 100 nm, wherein the adhesive material comprises:
30~40% acrylic resin (free radical ultraviolet curing agent);
35~45% isocyanate (thermal curing agent);
0.2~3% polyfunctional acrylic (diluting agent);
0.1~3% photoinitiator; and
0.2~6% photosensitizer and additive;

(d) ultraviolet-curing a surface of the spacer layer for 30 sec;
(e) thermal-curing or microwave-curing or anaerobic-curing or electron beam-curing the spacer layer;
(f) photoetching the spacer layer forming an pattern thereon;
(g) preparing an organic electroluminescent device on the spacer layer;
(h) ultraviolet-curing the organic electroluminescent device again for 60 sec after the step (g); and
(i) testing every photoelectric property and parameter of the organic electroluminescent device, wherein while using the ultraviolet curing-thermal curing or ultraviolet curing-microwave curing system, the step is firstly heat or microwave curing, then ultraviolet curing, and lastly heat or microwave curing; or firstly ultraviolet curing, then heat or microwave curing, and lastly ultraviolet curing.

The benefits of the present invention are listed as follows. 1) The adhesion performance of the spacer layer improves the adhesiveness between the organic electroluminescent device and the thin-film transistor so as to improve the performance of organic optoelectronic devices. 2) After preparing the organic electroluminescent device, the substrate is properly cured. Therefore, the spacer layer forms a tight structure that can prevent moisture and oxygen penetrating through the spacer layer, so as to improve the performance and prolong the lifespan of the device. 3) The proportion of the material and process parameters provided in the present invention can assure the better performance of the device. 4) The manufacturing method provided in the present invention can greatly lower the cost and process difficulty. 5) Combing the ultraviolet curing with other curing methods can make up for shortcomings in the ultraviolet curing system. It shows a good synergistic effect for combining the advantages of various polymerization reactions. It is a new method for modifying the high molecular material, and extends the application of the ultraviolet curing system between opaque mediums, on the substrate with complex shape, in the extra-thick coating and color coating.

These and other objectives, features, and advantages of the present invention will become apparent from the following detailed description, the accompanying drawings, and the appended claims.

DETAILED DESCRIPTION OF THE PREFERRED EMBODIMENT

The present invention is further explained with the accompanying drawings and examples in detail.

Figure 1:
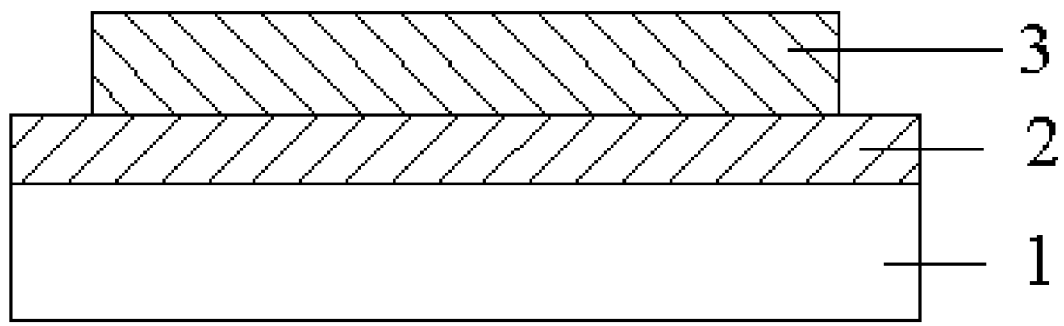
FIG. 1 is a perspective view of an active matrix organic electroluminescent device according to a preferred embodiment of the present invention.

Referring to FIG. 1 of the drawings, the present invention provides an active matrix organic electroluminescent device comprising a thin-film transistor 1, a spacer layer 2 deposited on a surface of the thin-film transistor 1, and an organic electroluminescent device 3 placed on a surface of the spacer layer 2.

The spacer layer 2 and the organic electroluminescent device 3 rely on the thin-film transistor 1 which has a predetermined water vapor and oxygen penetration resistance, good chemical stability and thermal stability.

The spacer layer 2, as an interlayer between the organic electroluminescent device and driving circuit, needs better planarity, insulation and adhesion, so it is usually made of organic adhesive materials.

Generally, the organic electroluminescent device 3 of the present invention adopts organic electroluminescent devices with various luminescence colors.

Figure 2:
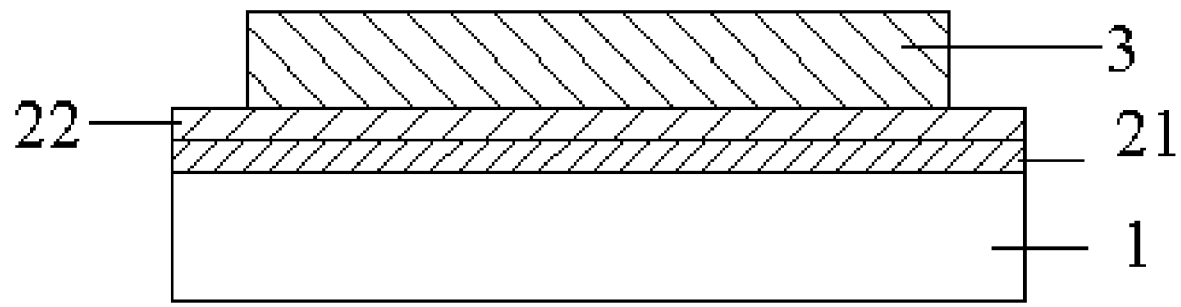
FIG. 2 is a perspective view of an active matrix organic electroluminescent device according to the sixth preferred embodiment of the present invention.

As shown in FIG. 2, a first spacer layer 21 of the present invention adopts an ultraviolet-curing adhesive deposited on the thin-film transistor 1. A second spacer layer 22 of the present invention adopts an adhesive deposited on the first spacer layer 21, which has same or different components and concentrations from that of the ultraviolet-curing adhesive used in the first spacer layer 21. Furthermore, a thickness of the first spacer layer is identical or different from that of the second spacer layer.

Every ingredient of the present invention is illustrated as follows.

The ultraviolet-curing technology, using ultraviolet as a curing energy, has its limitations which are mainly shown as: a predetermined limit to the shape of application substrate, low curing speed to color speed, difficult curing in deep and shadow area, poor adhesiveness and photoinitiator residues caused by larger volume contraction after curing and other problems. These deficiencies affect a further development and application of the ultraviolet-curing technology, while the shortcoming of larger volume contraction after curing also seriously affects the application range of ultraviolet-curing materials. Dual-curing technology is a combination of ultraviolet curing and other curing methods.

In a dual-curing system, the cross-linking and polymerization thereof is accomplished by two independent stages with different reaction principles, wherein one stage is ultraviolet curing reaction, and the other stage is dark reaction. The ultraviolet curing can be a free radical ultraviolet-curing, and also can be a cationic ultraviolet-curing. The dark curing can be a thermal curing, electron beam curing, anaerobic curing, microwave polymerization and so on. As a result, the ultraviolet curing allows the system to be quickly shaped or reach surface drying, while the dark curing allows the shadow or bottom areas to be completely cured.

Both the ultraviolet curing stage and the dark curing stage aim at the free radical and cationic ultraviolet-curing adhesive, so the free radical and cationic thermal curing, etc. exist.

Here are some typical examples of the system, as well as some specific operating parameters.

The free radical ultraviolet-curing agent comprises: polyester-acrylate, epoxy-acrylate, urethane-acrylate, polyether-acrylate and the materials having the following molecular structures;

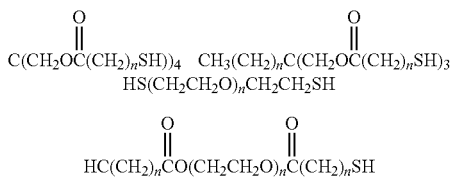

The cationic ultraviolet-curing agent comprises: epoxy resin or modified epoxy resin.

The plasticizer comprises: phthalic acid bis-1-octyl ester, phthalic acid bis-butyl ester, tris(2-butoxyethyl) phosphate, polyvinyl butyral resin, acetyl tri-n-butyl citrate, dimethyl phthalate, diethyl phthalate, hexanedioic acid bis(butoxyethoxy)ethyl ester, tetraisopropyl titanate, tetrabutyl titanate, citric acid ester, 2-ethylhexyl trimellitate, phthalic acid bis-2-ethylhexyl ester, diisooctyl sebacate, diethylene glycol dibenzoate, phthalic anhydride, dipropylene glycol dibenzoate, and chlorosulfonated polyethylene. The coupling agent comprises vinyl methyldichloro silane, methyldichlorosilane, dimethyldichlorosilane, dimethylchlorosilane, vinyltrichloro silane, 3-aminopropyltrimethoxysilane, polydimethylsiloxane, polymethylhydrosiloxane, polymethylmethoxylsiloxane, 3-glycidoxypropyltrimethoxysilane, 3-aminopropyltriethoxysilane, γ-glycidicether propyl trimethoxysilane, aminopropyltriethyoxysilane, 3-glycidoxypropyltrimethoxysilane, dodecyl-trimethoxysilane, ethenyltriethyloxysilane, vinyltrimethoxysilane, 3-chloropropyltriethoxysilane, bis-(triethoxysilylpropyl), anilinomethyltriethoxysliane, N-(β-aminoethyl)-γ-aminopropyltrimethoxy silane, N-(β-Aminoethyl)-γ-aminopropyltriethoxy silane, N-(β-(aminoethyl))-γ-aminopropyl-methyldimethoxy silane, 3-methacryloxypropyltrimethoxysilane, γ-methacryloxypropyltrimethylsilane, (3-mercaptopropyl) trimethoxysilane, and 3-mercaptopropyltriethoxysilane.

The free radical active diluting agent comprises the first generation of multi-functional acrylic monomer early developed, the second generation of multi-functional acrylic monomer recently developed, and the more outstanding third generation acrylic monomer.

The single-functional active diluting agent comprises: styrene, N-vinylpyrrolidone, iso-octyl acrylate, hydroxypropyl acrylate and isobornyl acrylate, methacrylate phosphate and isobornyl methacrylate, the latter two are good plasticized and toughening monomers.

The dual-functional active diluting agent comprises: triethylene glycol diacrylate, tripropylene glycol diacrylate, ethylene glycol diacrylate, polyethylene glycol diacrylate ester, neopentyl glycol diacrylate, and propoxylated neopentyl glycol diacrylate. The functional acrylate monomer mainly comprises 1,6-hexanediol diacrylate (HDDA), 1,4-butanediol diacrylate (BDDA), propylene glycol diacrylate (DPGDA), tripropylene glycol diacrylate (TPGDA), tri-functional trimethylol propane triacrylate (TMPTA), pentaerythritol triacrylate(PETA), trimethylol propane triacrylate (TMPTMA), trimethylolpropane triacrylate, propoxylated trimethylolpropane triacrylate, pentaerythritol triacrylate, propoxylated pentaerythritol acrylic ester, N,N-2-hydroxyethyl-3 aminopropanoate, triethylene glycol dimethacrylate, long-chain aliphatic acrylic glycidyl ether, resorcinol diglycidyl ether, dipentaerythritol pentaacrylate, tripropylene glycol diacrylate, and phthalate diethylene glycol diacrylate(P-DDA). They replace the first generation of single-functional acrylic monomer with small activity. But with the rapid development of ultraviolet-curing technology, they expose the shortcoming of great skin irritation.

The second generation of multi-functional acrylic monomer mainly introduces ethoxyl or propoxy into the molecule, thus overcoming the shortcoming of great irritation. Furthermore, the second generation of multi-functional acrylic monomer, such as ethoxylated 3-hydroxy-methyl propane triol triacrylate(TMP(EO)TMA), propoxylated hydroxy-3-methyl propane triol triacrylate (TMP(PO)TMA), propoxylated glycerol triacrylate (G(PO)TA), has higher activity and curing. The third generation of acrylic monomer is mainly acrylic ester containing methoxy, thus preferably solving the contradiction between high curing rate and shrinkage, and low curing degree. This kind of material is 1,6-hexanediol methoxy mono-acrylate (HDOMEMA), ethoxylated neopentyl glycol methoxy mono-acrylate(TMP(PO)MEDA). After introducing alkoxy into the molecule, the viscosity of the monomer will be reduced, at the same time the irritation of the monomer will also be reduced.

The introduction of alkoxy greatly improves the compatibility of diluent monomer, and ethenyltriethyloxy-silane (A15I), 3-glycidoxypropyltrimethoxysilane (A174) can be a monomer.

A variety of active epoxy resin diluting agents and various cyclic ethers, vinyl ether monomers and so on can be used as the diluting agents of cationic ultraviolet-curing resin. The vinyl ether compounds and oligomers have rapid curing speed, moderate viscosity, no odor, no toxin, and can be used in conjunction with the epoxy resin. The vinyl ether monomer comprises: 1,2,3-propanetriol glycidyl ether(EPON-812), triethyleneglycol divinyl ether(DVE-3), 1,4-butanediol divinyl ether(HBVE), cyclohexyl vinyl ether(CHVE), perfluoromethyl vinyl ether(PMVE), perfluoropropyl vinylether, isobutyl vinyl ether, hydroxybutyl vinyl ether, ethyl vinyl ether, ethoxy ethylene, vinyloxyethyl acrylate, 2-(2-propenyloxy)-ethanol, hydroxybutyl vinyl ether, butyl vinyl ether, chlorotrifluoroethylene(CTFE), triethyleneglycol divinyl ether, vinyl methyl ether, vinyl butyl ether, dodecyl vinyl ether(DDVE), cyclohexyl Vinyl ether, emulsifier BP, tetrafluoroethylene-perfluoropropyl vinyl ether, tetrafluoroethylene-perfluoropropyl vinyl ether, tert-Butyl vinyl ether:

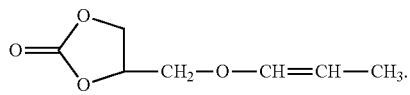

The epoxide monomer comprises: 3,4-epoxycyclohexyl-methyl-3',4'-epoxy-cyclohexane carboxylate (ERL-4221), bisphenol-A epoxy resin(EP), epoxy acrylic ester, epoxy vinyl ester, acrylic epoxy ester, methyl acrylic epoxy ester, water-soluble itaconic epoxy ester resin:

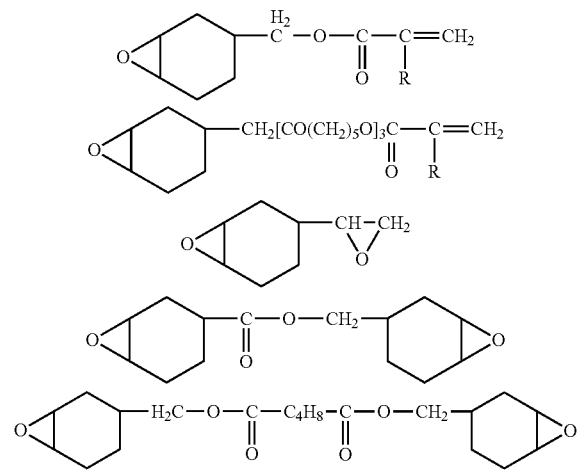

After absorbing ultraviolet energy, the photoinitiator is decomposed to produce free radical, thus leading to the polymerization of unsaturated bonds in the system to crosslink and cure as a whole. The free radical photoinitiators commonly used have two types of cracking and hydrogen capture.

The cleavage-type photoinitiator mainly comprises benzoin ether, benzil dimethyl ketal, acetyl benzene and so on. After absorbing ultraviolet, the cleavage-type photoinitiator will chap and produce two free radicals which lead to the polymerization of unsaturated groups. The benzoin ether comprises: benzoin, benzoin methyl ether, benzoin ethyl ether, benzoin butyl ether, benzoin oxime, and benzoin isopropyl ether. The acylphosphine oxide comprises: diphenyl (2,4,6-trimethylbenzoyl) phosphine oxide (PTO), phenyl bis (2,4,6-trimethyl benzoyl) phosphine oxide(BAPO), phenyl-bis(2,4,6-trimethylbenzoyl)phosphine oxide(819), 2,2,6,6-tetramethyl-1-piperidinyloxy(TEMPO), and triethyl phosphate(TEPO). They are ideal photoinitiators which have high photoinitiating activity and are capable of absorbing long-wave UVA, so they are adapted for white paint and thick film. Furthermore, they have good stability and will not change color or fade.

Hydrogen capture type photoinitiator mainly comprises benzophenone, thioxanthone and so on. The maximum absorption wavelength of thioxanthone photoinitiator in UVA area is in the range of 380-420 nm, the absorption capacity and hydrogen capacity of which is strong, thus having high initiator efficiency. Hydrogen capture type photoinitiator must have hydrogen donor as a collaborative component, otherwise, the initiating efficiency will too low and the photoinitiator can not be applied. The triplet state carbonyl free radical is more likely to extract the hydrogen from tertiary carbon of hydrogen molecule than secondary carbon or Methyl. It is more likely to extract the hydrogen connecting to the oxygen or nitrogen than the hydrogen connecting to the carbon. This hydrogen molecule comprises amine, alcohol amine (triethanolamine, methyldiethanolamine, trisopropanolamine and so on), thiols, and N,N-diethyl-p-dimethylaminobenzamide.

In benzophenone photoinitiating system, benzophenone needs combining with alcohol, ether or amine to make vinyl monomer photopolymerization. The benzophenone photoinitiating system mainly comprises: benzophenone, thia-anthraquinone, michler's ketone, 2,2-dimethoxy-2-phenylacetophenone(DMPA), α-hydroxy-2,2-dimethylacetophenone(1173), α-hydroxy cyclohexyl phenyl ketone (184), α-amine alkyl ketones, 2-methyl-4'-(methylthio)-2-morpholinopropiophenone (MMMP), DBMD, (4-dimethyl amino-phenyl)-(1-piperidinyl)-methanone, isopropyl thioxanthone (ITX), (4-dimethyl amino-phenyl)-(4-morpholinyl)-methanone, 2-hydroxy-2-methylpropiophenone, diphenoxydiphenylsulfone ketone, 2-hydroxy-2-methylpropiophenone, and mixed systems, such as an initiator system combining with diphenyl ketone and tertiary amine, which is capable of eliminating the inhibition function that oxygen in adhesive film applies to radical polymerization; thiomichlers ketone used in conjunction with diphenyl ketone can get a relatively cheap and very effective initiator system.

The cationic photoinitiator: aromatic sulfonium salt and iodonium salt initiators have excellent high temperature stability, and have also stability after cooperating with epoxy resin, so they are widely used in cationic curing system. Such initiators comprise: bis(4-methylphenyl)iodonium hexafluorophosphate (PI810), [hydroxy (toxyloxy) iodo] benzene (HTIB), bisdodecylphenyliodonium hexafluoroantimonate, xylyl iodonium salt, diphenyliodonium hexafluoroarsenate, [4-(2-hydroxy-3-butoxy-1-propoxy)phenyl]phenyliodonium hexafluoroantimonate, 4-[p-benzoyl (thiophenyl)phenyl] phenyl iodonium hexafluorophosphate, 4-[4-benzoyl (phenoxy)phenyl]phenyl iodonium hexafluorophosphate, 4-[p-Benzoyl (thiophenyl)phenyl]phenyl iodonium hexafluorophosphate, iodonium bis(4-methylphenyl) hexafluorophosphate (IHT-PI 820), 4,4'-diacetamidodiphenyliodonium hexafluorophosphate, 3,7-dinitrodibenzohalonium salt, 3,7-dinitrodibenzocyclobromonium salt, diphenyliodonium fluoroborate, 3,3'-dinitro-diphenyl iodonium salt, 3,3'-dinitro-diphenyl iodonium salt, several kinds of 2,2'-disubstituted (iodine, bromine, chlorine)-5,5'-dinitrophenyl iodonium salt, iodide 2-[2-(3-indolizine) vinyl]-1-methylquinoline onium salt, iodide 4-(2-benzoxazolyl)-N-methyl-pyridinium, 3-nitrophenyl 2-phenyl-sulfur hexafluorophosphate, triarylphosphine dihydro imidazolium salt, triarylphosphine 1,1'-binaphthyl-dihydro-imidazolium salt, 3,7-dinitrodibenzobromonium salt, triphenylsulfonium tosylate, triphenylsulfonium bromide, 4-phenylthio)phenyl diphenyl sulfonium hexafluorophosphate salt, 4-phenylthio triphenyl sulfonium hexafluorophosphate salt, 3,3'-dinitro diphenyliodonium hexafluorophosphate, 3-nitro phenyl diphenyl sulfonium hexafluorophosphate salt, triphenyl sulfonium salt, 4-chlorophenyl 2-phenyl-sulfur hexafluorophosphate, 3-nitrophenyl diphenyl-sulfur hexafluorophosphate, 4-acetyl-amino-phenyl-2-phenyl-sulfur hexafluorophosphate, 3-benzoyl-phenyl-2-phenyl-sulfur hexafluorophosphate, 3-phenyl-sulfur fluoride borate, 3-phenyl-sulfur hexafluorophosphate, 3-phenyl-sulfur hexafluoro antimonate, 4-tolyl diphenyl sulfur hexafluorophosphate, phosphorus hexafluoride triarylsulfonium salt, antimony hexafluoride triarylsulfonium salt, 4-[p-benzoyl (thiophenyl) phenyl]phenyl iodonium hexafluorophosphate, 1-(4'-bromo-2'-fluoro-benzyl)pyridinium chlorochr, 4-[p-benzoyl (thiophenyl)phenyl]phenyl iodonium hexafluorophosphate, {4-[4-p-nitrobenzoyl(thiophenyl)phenyl]}phenyl iodonium hexafluorophosphate, {4-[4-p-methylbenzoyl(thiophenyl) phenyl]}phenyl iodonium hexafluorophosphate, {4-[4-p-methylbenzoyl(phenoxy)phenyl]}phenyl iodonium hexafluorophosphate, 4-[p-benzoyl (phenoxy)phenyl]phenyl iodonium hexafluorophosphate, and bis-dodecylphenyliodonium hexafluoroantimonate.

The ferrocene salt photoinitiating system uses a new cationic photoinitiator after the diaryliodonium salt and triaryliodonium salt, which mainly comprises: cyclopentadienyl-iron-benzene salt, cyclopentadienyl-iron-toluene salt, cyclopentadienyl-iron-p-xylene salt, cyclopentadienyl-iron-naphthalene salt, cyclopentadienyl-iron-biphenyl salt, cyclopentadienyl-iron-2,4-dimethyl acetophenone salt, acetyl-cyclopentadienyl-iron-p-xylene salt, cyclopentadienyl-iron-anisole salt, cyclopentadienyl-iron-ether salt, cyclopentadienyl-iron-2,4-diethoxybenzene salt, ferricenium tetrafluoroborate salt, toluene ferrocene tetrafluoroborate, cyclopentadienyl-iron-anisole salt, cyclopentadienyl-iron-diphenyl ethersalt, cyclopentadienyl-iron-1,4-diethoxybenzene salt, cyclopentadienyl-iron-chlorophenyl salt, cyclopentadienyl-iron-(1,4-2-ethoxy benzene) hexafluorophosphate, cyclopentadienyl-iron-ether hexafluorophosphate, 1,10-phenanthroline ferrous perchlorate salt, 1,10-phenanthroline ferrous sulfate salt cyclopentadienyl-iron-anisole salt, cyclopentadienyl-iron-ether salt, [1,1'-bis (diphenylphosphino) ferrocene] nickel dichloride, vinylferrocene, N,N'-bis(ferrocenylmethylene)diaminobutane, ferrocene amide, ferrocene acyl acid, acetylferrocene, ethylferrocene, butyrylferrocene, butyl ferrocene, N,N-dimethylamine methyl-ferrocene, 1,1'-dibenzoylferrocene, 3-ferrocenoylpropionic acid, 1,1'-dibromoferrocene and aminoferrocene.

In ultraviolet curing-thermal curing system, it is found that the mechanical properties of cured products after heat process has been obviously improved, and with the increase of epoxy components, the mixed system has a very good adhesion property on metal and other substrates. On the one hand, the reason is that the contraction is small while epoxide curing, on the other hand, internal stress generated by free radical light-curing is eliminated while thermal curing. In accordance with a substrate for flexible optoelectronic devices provided in the present invention, it is characterized in that: thermal curing agent in the thermal curing method comprises epoxy resin, isocyanate, amino resin, and free radical curing agent.

The epoxy resin comprises aliphatic amine, aromatic amine, dicyandiamide, imidazole, organic acid anhydride, organic hydrazide, lewis acid amine and microcapsule.

The aliphatic amine comprises: ethylenediamine, hexamethylene diamine, diethylenetriamine, triethylenetetramine, hydroxyethyl diethylene triamine, hydroxyl isopropyl diethylenetriamine, poly ethane diacid adipamide, diethanolamine, tetramethylethylenediamine, diamine glycyrrhizinate, 2-(2-aminoethylamino)ethanol, 2 (4-amino phenoxy)phenyl phosphorus oxide, 2 (3-amino phenoxy)phenyl phosphorus oxide, tetrapropylene glycol diamine, 2-(2-aminoethylamino)ethanol, methyl-cyclopentane diamine, polyether amine, phenolic aldehyde amine curing agent (T-31), hydroxyethyl ethylene diamine, isophorone diamine, menthane diamine, dimethyl ammonium propylamine, bis(4-amino-3-methyl-cyclohexyl)methane, tetramethyl-1,3-diaminopropane, modified amine epoxy curing agent(593), aliphatic amine epoxy curing agent (3380,TG-03,LX-502, D230), and aliphatic amine modified adduct (HB-206,HB-205,HB-2512,HB-9305,HB-9409).

Dicyandiamide comprises dicyandiamide, dicyandiamide derivates modifying 3,5-disubstituted aniline (HT 2833, HT2844), dicyandiamide (MD02, made by the reaction of propylene oxide and dicyandiamide), modified dicyandiamide derivates (AEHD-610, AEHD-210), and derivates containing following formula of

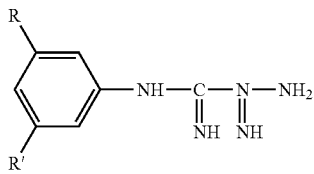

Aromatic amine comprises: 4,4-diaminodiphenyl sulfone (DDS), 4,4'-diaminodiphenylmethane (DDM), phenylenediamine (m PDA), 1,8-diaminonaphthalene, diethyltoluenediamine, 1,2-diaminobenzene, p-phenylene diamine, allyl-containing diamine, N-(aminopropyl)-toluene diamine, isophorone diamine, 2-dimethylamine ethanol, dimethyl benzyl amine, triethyl benzyl ammonium chloride, dimethyl benzyl amine, n-benzyldimethylamine, 2,4,6-tris-(dimethylaminomethyl)phenol, phenol-aldehyde-hexanediamine, N,N-dimethyl benzyl amine (BDMA), N-(p-carboxyphenyl) maleimide (p-CPMD).

Imidazole comprises: 1-methylimidazole, 2-ethylimidazole, 2-phenylimidazole, 2-methylimidazole, 1-8-aminoethyl-2-methylimidazole (AMz), 2-undecylimidazole hexanedioic acid, dis salt, 2-ethylimidazole, 2-ethyl-4-methylimidazole (2E4Mz), 1-(2-amino-ethyl)-2-methylimidazole, 1-cyano-2-ethyl-4-methylimidazole, 2-heptadecyl imidazole, 2-ethyl-4-methylimidazole-carboxylic, 3-2 hydroxymethyl-substituted imidazole derivatives, 1,3-2-phenyl-2-methylimidazolium chloride, 1-decyl alkyl-2-ethylimidazole, and modified imidazole (JH-0511, JH-0512, JH-0521).

Organic acid anhydride comprises: LEPB with anhydrides, maleic anhydride, 70# acid anhydride (synthesized by butadiene and maleic anhydride), 647# acid anhydride (synthesized by dicyclopentadiene and maleic anhydride), 308 TOA (synthesized by maleic anhydride modified by tung oil, and methyl endomethylene tetrahydrophthalic anhydride (MNA)), pyromellitic dianhydride (PMTA) (mixed by pyromellitic dianhydride with maleic anhydride), methylhexahydrophthalic anhydride(MeHHPA), diphenyl ether dianhydride, phthalic anhydride (PA), hexahydrophthalic anhydride (HHPA), tetrahydrophthalic anhydride (THPA), methyltetrahydrophthalic anhydride, LEPB with anhydrides, trimellitic anhydride (TMA), tetrabromophthalic anhydride, and poly nona-acetic anhydride (PAPA).

Organic hydrazide comprises: sebacic dihydrazide (SDH), adipic dihydrazide, carbonic dihydrazide, oxalyl dihydrazide, succinic dihydrazide, adipic dihydrazide, N-aminopolyacrylamide, $N(CH_2CH_2CONHNH_2)_3$, $(H_2NHNCO-CH_2CH_2)_2NCH_2CH_2N-(CHCHCONHNH_2)_2$, succinic acid hydrazide, sebacic acid hydrazide, sebacic acid hydrazide, p-Hydroxybenzoic acid hydrazide (POBH), azelaic dihydrazide, and iso-phthalic dihydrazide.

Lewis acid amine, obtained by $BF_3$, $AlCl_3$, $ZnCl_2$, $PF_5$ and other lewis acids with primary amine or secondary amine to form complex, comprises cyclopentadienyl cumene iron hexafluorophosphate (Irgacure 261), boron trifluoride and ferrocene tetrafluoroborate.

Microencapsulation comprises cellulose, gelatin, polyvinyl alcohol, polyester, and polysulfone.

Isocyanate comprises: triallyl cyanurate, toluene diisocyanate (TDI), diphenyl-methane-diisocyanate (MDI), polyaryl polymethylene isocyanate (PAPI), hexamethylene diisocyanate (HDI), isophorone diisocyanate (IPDI), trimethyl-hexamethylene diisocyanate (TMDI), methylene-bis (4-cyclohexylisocyanate) (HMDI), xylyl diisocyanate (XDI), tetr-amethylenexylene diisocyanate (TMXDI), methylstyrene isocyanate (TMI), 6-hydrogen Toluene diisocyanate (HTDI), nitrile butadiene rubber, 7-isocyanate, triphenyl-methane-4-4'-4'-triisocyanate, tris(4-isocyanatophenyl) thiophosphate, tetraisocyanate, 7-isocyanate, biuret-containing polyisocyanate, tetrahydrofuran polyether polyols-epoxy resin-isocyanate, and tri-hydroxy poly propylene oxide polyols-isocyanate.

Amino resin comprises: 4,4'-diaminodiphenylmethane (DDM), N-dichloro-phenyl-N—N-dimethyl urea, 3-phenyl-1,1-dimethylurea, 3-(p-chlorophenyl)-1,1-dimethyl-urea, 4,4'-diamino diphenyl bisphenol, polyurethane, urea-formaldehyde resin, epoxy-ethylenediamine carbamate, N,N,N',N'-tetra propargyl-P,P'-diaminao diphenyl methane (TPDDM), tris(dimethylaminomethyl)phenol, 2,4-diaminotoluene, tris-(dimethylaminomethyl)phenol, polyurethane, methylated urea formaldehyde resin, tris(3-aminopropyl) amine, 2-aminoethyl-bis(3-aminopropyl)amine, N,N,N',N'-tetra(3-aminopropyl)ethylenediamine, 1-[2(3-amino-propyl)amino]-2-propanol, N-(2-aminoethyl)-N-(3-amino-propyl)amine, 1-[(2-amino-ethyl)-(3-aminopropyl)amino]-1-ethanol, 1-[(2-amino-ethyl)-(3-amino-propyl)amino]-2-propanol, 3-dimethyl aminopropyl amine, 4,4'-diaminodiphenylmethane (DDM), 4,4'-diamino diphenyl bisphenol, 4,4'-diaminodiphenylsulfone (DDS), tris(3-aminopropyl) amine, melamine resin, benzoguanamine resin, hexahydroxy-methyl melamine resin, methylated melamine resin, methylated benzoguanamine resin, methylated melamine-urea formaldehyde resin, hexamethoxy methyl melamine resin (HMMM), methanol modified trimethylol melamine, urea-melamine formaldehyde resin, polyester melamine, 2-sec-butyl-phenyl-N-methyl-amino acid ester, dichloro-isocyanurate, trichloro-isocyanurate, amino-triazine resin, urethane acrylate, 4-aminopyridine resin, N-β-aminoethyl amino-polyester resin, α-aminopyridine resin, amino diphenyl ether resin, aminopolysiloxane, phosphoramidic resin, maleopimaric acid polyester amino resin, chelating resin of dithiocarbamic acid type consisting a piperazine backbone, and hydroxyethyl amino-polyester resin.

The free radical thermal curing agent comprises: dicumyl peroxide, epoxy acrylate, benzoic acid tert-butyl ester, polyurethane acrylate, polyurethane diol, polyester triol, bis(hexafluoro phosphate, polymethylmethacrylate (PMMA), styrene-acrylate, polybutadiene hydroxyl acrylate, polyester urethane acrylate, epoxy acrylate, methyl methacrylate butadiene-benzene diene copolymer, butadiene-methyl methacrylate, ethylene-acrylate, polyacrylate, chlorinated polypropylene-acrylic ester, polymethylmethacrylate, poly (ethyl methacrylate), cyanoacrylate, 2-acrylic acid-1,2-propanediol monoester, methylmethacrylate, ethyl methacrylate, n-butyl methacrylate, hydroxyethyl methacrylate, isobutyl methacrylate, isobutyl methacrylate, iso-octyl methacrylate, 2-(dimethylamino)ethyl methacrylate, methacrylate, ethyl acrylate, n-butyl acrylate, hydroxypropyl acrylate, 2-hydroxyethyl acrylate, 2-ethylhexyl acrylate, vinyl acetate-butyl acrylate, and polymethylmethacrylate.

In the ultraviolet curing-microwave curing system, microwave curing agent in microwave curing method is the same as thermal curing agent in thermal curing method. Its technical feature is using a microwave curing method to cure the thermal curing agent. Particular "inside molecule" uniform heating method of microwave makes resin uniform curing, high speed, easy to control, energy saving and less investment. In recent years, more and more attentions have been paid to the research on microwave curing, instead of thermal curing, in thermosetting resin and composite material thereof.

The anaerobic curing agent in the anaerobic curing system comprises: tetraethylene glycol dimethacrylate, triethlene glycol bismethylacrylate (such as Loctite 290 made in the United States, Loctite 271 and Loctite 277 mixed with bisphenol A fumarate unsaturated polyester, and so on), ester resin, bisphenol-A vinyl ester resin (V-411), epoxy vinyl ester resin (V-901), epoxy acrylate resin (BRT2000), maleimide resin, N,N'-4,4'-diphenylmethane-bismaleimide, bisphenol A-diphenyl ether bismaleimide, bisphenol A maleic acid-vinyl resin, yinyl ester resin, brominated vinyl ester resin, fumaric acid mixed vinyl ester resin, acrylic mixed vinyl ester resin, carbamate mixed vinylester resin, rubber mixed vinylester resin, phenolic vinyl ester resin, isocyanate mixed epoxy acrylate, toluene diisocyanate mixed 2-hydroxyethyl acrylate, hydroxymethyl bisphenol-A epoxy resin, bisphenol A acrylate, polyurethane acrylate, bisphenol-A epoxy vinyl ester resin, bisphenol-A benzoxazine epoxy resin, bisphenol fluorene epoxy resin, bisphenol-A epoxy acrylate resin, bisphenol-A type epoxy resin, and bisphenol-A epoxy allyl chloride ester resin.

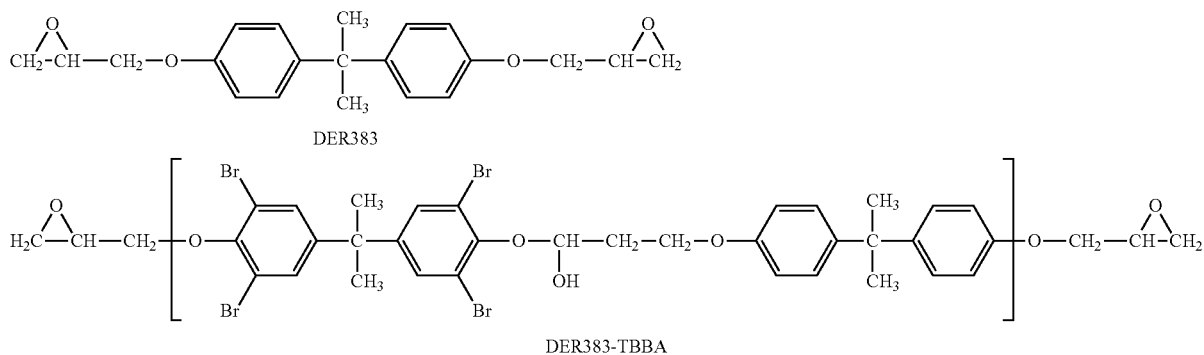

TEGDMA, glycol dimethacrylate, 2-hydroxyethyl methacrylate or 2-hydroxypropyl methacrylate (such as Anchor 302 made in China, three bonds 1030 made in Japan), bisphenol A epoxy ester (such as Y-150, GY-340 and so on, which are a mixture of epoxy ester and multi-diethylene glycol ester made in China), the reaction product of hydroxy alkyl methacrylate and polyol (such as Loctite 372 made in United States, GY-168, Anchor 302 and BN-601 made in China), polyurethane, polyurethane hydrogen iso-ester, hydroxylpropyl methacrylate, hydroxyl propyl methacrylate-polyether, polyurethane based on hydroxyl-terminated polybutadiene, polyurethane acrylic, 2-hydroxypropyl acrylate(HPA), triethlene glycol bismethylacrylate, cumyl hydroperoxide, o-cresol formaldehyde epoxy acrylate, poly(ethylene glycol) methyl ether methacrylate, triethylene glycol phthalate ester, β-hydroxyethyl methacrylate, trimethylolpropane trimethacrylate, triethylene glycol dimethacrylate, triethlene glycol bismethylacrylate, dimethacryloylethylthioether, phthalic acid diethylene glycol diacrylate, ethoxylated bisphenol A dimethacrylate, bisphenol A glycol dimethacrylate resin, ethylene methyl acrylate, triethlene glycol bismethylacrylate, ethylene glycol methacrylate, diethylene glycol dimethacrylate, phthalic anhydride-diethylene glycol methacrylate, epoxy methacrylate resin, diethylene glycol dimethacrylate, triethylene-glycol dimethacrylate, acrylic urethane, 2-cyanoacrylic acid methyl ester, ethyl-2-cyanoacrylate, methacrylic acid 2,3-epoxypropyl ester, poly (ethylene glycol) dimethacrylate, triethylene glycol dimethacrylate, methacrylic acid dicyclopentadiene-oxygenethyl ester, and 2-(dimethylamino)ethyl methacrylate.

In the ultraviolet curing-electron beam curing system, the electron beam curing agent in the electron beam curing method comprises: tri (4-hydroxyphenyl)methane glycidyl ether epoxy resin, epoxy-dicyclopentadiene bisphenol type The detailed examples of the present invention are explained as follows.

EXAMPLE 1

As shown in FIG. 1, the organic electroluminescent device 3 is embodied as a blue organic electroluminescence device. The spacer layer 2 adopts a single layer free radical ultraviolet curing agent-isocyanate thermal curing agent dual-curing system. The thin-film transistor 1 is an active driving circuit. A picture of the actual object is shown in FIG. 2.

The method of manufacture comprises the steps of:
① ultrasonically cleaning the organic electroluminescent device by detergent, acetone solution, ethanol solution and deionized water, and drying the organic electroluminescence device by blowing dry nitrogen thereto;
② preparing a thin-film transistor on a processed substrate;
③ stirring an adhesive material diluted by ethanol for 20 hours forming a mixture, wherein the adhesive material: ethanol is 1:10, applying the mixture onto a surface of the thin-film transistor in a spinning manner for a minute forming a spacer layer, wherein the spinning rate is 2000 rev/sec and the thickness of the spacer layer is about 100 nm,
  wherein the adhesive material comprises:
    30~40% acrylic resin (free radical ultraviolet curing agent);
    35~45% isocyanate (thermal curing agent);
    0.2~3% polyfunctional acrylic (diluting agent);
    0.1~3% photoinitiator; and
    0.2~6% photosensitizer and additive;
④ curing the spacer layer with ultraviolet for 30 seconds;
⑤ thermal-curing the spacer layer in a baking oven at 110° C. for 20 min; (wherein the steps ③ and ④ can be exchanged)

⑥ photoetching the spacer layer forming an pattern thereon;
⑦ preparing an organic electroluminescent device on the spacer layer;
⑧ ultraviolet-curing again for 60 sec after the step ⑦; and
⑨ testing every photoelectric property and parameter of the organic electroluminescent device.

Table 1 shows a performance comparison between the active matrix driving organic electroluminescent device using a spacer layer material provided in the present invention, and the active matrix driving organic electroluminescent device using a traditional spacer layer material.

TABLE 1

| AMOLED specification | leakage current of conventional spacer layer (μA) | leakage current of spacer layer provided in present invention (μA) |
|---|---|---|
| 1.5 inches 128 × 3 × 128 | 46 | 0.11 |
| 2 inches 128 × 3 × 160 | 75 | 0.2 |
| 4 inches 320 × 3 × 240 | 170 | 2.9 |

EXAMPLE 2

As shown in FIG. 1, the organic electroluminescent device 3 is embodied as a green organic electroluminescence device. The spacer layer 2 adopts a single layer free radical ultraviolet curing agent-epoxy resin thermal curing agent dual-curing system. The thin-film transistor 1 is an active driving circuit.

The method of manufacture comprises the steps of:
① ultrasonically cleaning an organic electroluminescent device by detergent, acetone solution, ethanol solution and deionized water, and drying the organic electroluminescence device by blowing dry nitrogen thereto;
② preparing a thin-film transistor on a processed substrate;
③ stirring an adhesive material diluted by ethanol for 20 hours forming a mixture, wherein the adhesive material: ethanol is 1:10, applying the mixture onto a surface of the thin-film transistor in a spinning manner for a minute forming a spacer layer, wherein the spinning rate is 2000 rev/sec and the thickness of the spacer layer is about 100 nm,
wherein the adhesive material comprises:
30~40% unsaturated polyester resin (free radical ultraviolet curing agent);
35~45% epoxy resin (thermal curing agent);
0.2~3% polyfunctional acrylic (diluting agent);
0.1~3% photoinitiator; and
0.2~6% photosensitizer and additive;
④ curing the spacer layer with ultraviolet for 30 seconds;
⑤ curing the spacer layer in a baking oven at 110° C. for 20 min (wherein the steps ③ and ④ can be exchanged);
⑥ photoetching the spacer layer forming an pattern thereon;
⑦ preparing an organic electroluminescent device on the spacer layer;
⑧ ultraviolet-curing again for 60 sec after the step ⑦; and
⑨ testing every photoelectric property and parameter of the organic electroluminescent device.

EXAMPLE 3

As shown in FIG. 1, the organic electroluminescent device 3 is embodied as a red organic electroluminescence device. The spacer layer 2 adopts a single layer cationic epoxy ultraviolet curing agent-amino resin thermal curing agent dual-curing system. The thin-film transistor 1 is an active driving circuit.

The method of manufacture comprises the steps of:
① ultrasonically cleaning the organic electroluminescent device by detergent, acetone solution, ethanol solution and deionized water, and drying the organic electroluminescence device by blowing dry nitrogen thereto;
② preparing a thin-film transistor on a processed substrate;
③ stirring an adhesive material diluted by ethanol for 20 hours forming a mixture, wherein the adhesive material: ethanol is 1:10, applying the mixture onto a surface of the thin-film transistor in a spinning manner for a minute forming a spacer layer, wherein the spinning rate is 2000 rev/sec and the thickness of the spacer layer is about 100 nm,
wherein the adhesive material comprises:
35~45% epoxy resin (cationic ultraviolet curing agent);
40~45% amino resin (thermal curing agent);
4.0~9% diluting agent (vinyl ether monomer);
1.2~3% cationic photoinitiator (aromatic iodonium salt); and
0.2~3% photosensitizer and additive;
④ curing the spacer layer with ultraviolet for 30 seconds;
⑤ thermal-curing the spacer layer in a baking oven at 110° C. for 20 min; (wherein the steps ⑤ and ④ can be exchanged)
⑥ photoetching the spacer layer forming an pattern thereon;
⑦ preparing an organic electroluminescent device on the spacer layer;
⑧ ultraviolet-curing again for 60 sec after the step ⑦; and
⑨ testing every photoelectric property and parameter of the organic electroluminescent device.

EXAMPLE 4

As shown in FIG. 1, the organic electroluminescent device 3 is embodied as a color organic electroluminescence device. The spacer layer 2 adopts a single layer free radical ultraviolet curing agent-anaerobic curing agent dual-curing system. The thin-film transistor 1 is an active driving circuit.

The method of manufacture comprises the steps of:
① ultrasonically cleaning the organic electroluminescent device by detergent, acetone solution, ethanol solution and deionized water, and drying the organic electroluminescence device by blowing dry nitrogen thereto;
② preparing a thin-film transistor on a processed substrate;
③ stirring an adhesive material diluted by ethanol for 20 hours forming a mixture, wherein the adhesive material: ethanol is 1:10, applying the mixture onto a surface of the thin-film transistor in a spinning manner for a minute forming a spacer layer, wherein the spinning rate is 2000 rev/sec and the thickness of the spacer layer is about 100 nm,
wherein the adhesive material comprises:
55~65% polymercaptan-polyene (free radical ultraviolet curing agent);
20~30% dimethacrylate polyol ester (anaerobic curing agent);
0.2~3% single functional acrylate (diluting agent);
0.1~3% photoinitiator; and
0.2~6% photosensitizer and additive;
④ curing the spacer layer with ultraviolet for 30 seconds;
⑤ thermal-curing the spacer layer in a baking oven at 110° C. for 20 min; (wherein the steps ③ and ④ can be exchanged)

⑥ photoetching the spacer layer forming an pattern thereon;
⑦ preparing an organic electroluminescent device on the spacer layer;
⑧ ultraviolet-curing again for 60 sec after the step ⑦; and
⑨ testing every photoelectric property and parameter of the organic electroluminescent device.

EXAMPLE 5

As shown in FIG. 1, the organic electroluminescent device 3 is embodied as a color organic electroluminescence device. The spacer layer 2 adopts a single layer cationic ultraviolet curing agent-electron beam curing agent dual-curing system. The thin-film transistor 1 is an active driving circuit.

The method of manufacture comprises the steps of:
① ultrasonically cleaning the organic electroluminescent device by detergent, acetone solution, ethanol solution and deionized water, and drying the organic electroluminescence device by blowing dry nitrogen thereto;
② preparing a thin-film transistor on a processed substrate;
③ stirring an adhesive material diluted by ethanol for 20 hours forming a mixture, wherein the adhesive material:ethanol is 1:10, applying the mixture onto a surface of the thin-film transistor in a spinning manner for a minute forming a spacer layer, wherein the spinning rate is 2000 rev/sec and the thickness of the spacer layer is about 100 nm, wherein the adhesive material comprises:
30~35% epoxy resin or modified epoxy resin (cationic ultraviolet curing agent);
50~55% bisphenol-A vinyl ester resin (electron beam curing agent);
0.4~6% diluting agent (active epoxy resin);
0.1~3% cationic photoinitiator (aromatic sulfonium salt); and
0.2~3% photosensitizer and additive;
④ curing the spacer layer with ultraviolet for 30 seconds;
⑤ thermal-curing the spacer layer in a baking oven at 110° C. for 20 min; (wherein the steps ③ and ④ can be exchanged)
⑥ photoetching the spacer layer forming an pattern thereon;
⑦ preparing an organic electroluminescent device on the spacer layer;
⑧ ultraviolet-curing again for 60 sec after the step ⑦; and
⑨ testing every photoelectric property and parameter of the organic electroluminescent device.

EXAMPLE 6

As shown in FIG. 1, the organic electroluminescent device 3 is embodied as a color organic electroluminescence device. The spacer layer 2 adopts a single layer cationic ultraviolet curing agent-anaerobic curing agent dual-curing system. The thin-film transistor 1 is an active driving circuit.

The method of manufacture comprises the steps of:
① ultrasonically cleaning the organic electroluminescent device by detergent, acetone solution, ethanol solution and deionized water, and drying the organic electroluminescence device by blowing dry nitrogen thereto;
② preparing a thin-film transistor on a processed substrate;
③ stirring an adhesive material diluted by ethanol for 20 hours forming a mixture, wherein the adhesive material:ethanol is 1:10, applying the mixture onto a surface of the thin-film transistor in a spinning manner for a minute forming a spacer layer, wherein the spinning rate is 2000 rev/sec and the thickness of the spacer layer is about 100 nm, wherein the adhesive material comprises:
60~65% epoxy resin or modified epoxy resin (cationic ultraviolet curing agent);
25~30% dimethacrylate polyol ester (anaerobic curing agent);
0.4~9% active epoxy resin (diluting agent);
0.1~3% cationic photoinitiator (aromatic sulfonium salt); and
0.2~3% photosensitizer and additive;
④ curing the spacer layer with ultraviolet for 30 seconds;
⑤ thermal-curing the spacer layer in a baking oven at 110° C. for 20 min; (wherein the steps ③ and ④ can be exchanged)
⑥ photoetching the spacer layer forming an pattern thereon;
⑦ preparing an organic electroluminescent device on the spacer layer;
⑧ ultraviolet-curing again for 60 sec after the step ⑦; and
⑨ testing every photoelectric property and parameter of the organic electroluminescent device.

EXAMPLE 7

As shown in FIG. 1, the organic electroluminescent device 3 is embodied as a color organic electroluminescence device. The spacer layer 2 adopts a single layer free radical ultraviolet curing agent-electron beam curing agent dual-curing system. The thin-film transistor 1 is an active driving circuit.

The method of manufacture comprises the steps of:
① ultrasonically cleaning the organic electroluminescent device by detergent, acetone solution, ethanol solution and deionized water, and drying the organic electroluminescence device by blowing dry nitrogen thereto;
② preparing a thin-film transistor on a processed substrate;
③ stirring an adhesive material diluted by ethanol for 20 hours forming a mixture, wherein the adhesive material:ethanol is 1:10, applying the mixture onto a surface of the thin-film transistor in a spinning manner for a minute forming a spacer layer, wherein the spinning rate is 2000 rev/sec and the thickness of the spacer layer is about 100 nm, wherein the adhesive material comprises:
35~40% unsaturated polyester resin (free radical ultraviolet curing agent);
50~55% bisphenol-A vinyl ester resin (electron beam curing agent);
0.2~3% active epoxy resin (diluting agent);
0.1~3% cationic photoinitiator (aromatic sulfonium salt); and
0.2~6% photosensitizer and additive;
④ curing the spacer layer with ultraviolet for 30 seconds;
⑤ thermal-curing the spacer layer in a baking oven at 110° C. for 20 min; (wherein the steps ③ and ④ can be exchanged)
⑥ photoetching the spacer layer forming an pattern thereon;
⑦ preparing an organic electroluminescent device on the spacer layer;
⑧ ultraviolet-curing again for 60 sec after the step ⑦; and
⑨ testing every photoelectric property and parameter of the organic electroluminescent device.

EXAMPLE 8

As shown in FIG. 2, the organic electroluminescent device 3 is embodied as a color organic electroluminescence device.

The spacer layer 2 adopts a double free radical ultraviolet curing agent-isocyanate thermal curing agent dual-curing system adhesive. The thin-film transistor 1 is an active driving circuit.

The method of manufacture comprises the steps of:

① ultrasonically cleaning the organic electroluminescent device by detergent, acetone solution, ethanol solution and deionized water, and drying the organic electroluminescence device by blowing dry nitrogen thereto;

② preparing a thin-film transistor on a processed substrate;

③ stirring an adhesive material diluted by ethanol for 30 hours forming a mixture, wherein the adhesive material: ethanol is 1:1, applying the mixture onto a surface of the thin-film transistor in a spinning manner for a minute forming a first spacer layer, wherein the spinning rate is 4000 rev/sec and the thickness of the first spacer layer is about 100 nm, wherein the adhesive material comprises:
- 30~40% acrylic resin (free radical ultraviolet curing agent);
- 35~45% isocyanate (thermal curing agent);
- 0.2~3% poly functional acrylic (diluting agent);
- 0.1~3% photoinitiator; and
- 0.2~6% photosensitizer and additive;

④ curing the spacer layer with ultraviolet for 60 seconds, and then thermal-curing in a heating furnace at 110° C. for 10 minutes;

⑤ stirring an adhesive material diluted by ethanol for 20 hours forming a mixture, wherein the adhesive material: ethanol is 1:10, applying the mixture onto the first spacer layer in a spinning manner for a minute forming a second spacer layer, wherein the spinning rate is 2000 rev/sec and the thickness of the second spacer layer is about 100 nm, ⑥ curing the spacer layer with ultraviolet for 30 seconds, and then thermal-curing in the heating furnace at 110° C. for 10 minutes;

⑦ photoetching the spacer layer forming an pattern thereon;

⑧ preparing an organic electroluminescent device on the spacer layer;

⑨ thermal-curing again the substrate coated with conductive film at 110° C. for 10 min; and ⑩ testing transmittance, surface morphology of the substrate and every parameter.

One skilled in the art will understand that the embodiment of the present invention as shown in the drawings and described above is exemplary only and not intended to be limited.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An active matrix organic electroluminescent device, comprising:
   a thin-film transistor;
   an organic electroluminescent device; and
   a spacer layer deposited between said thin-film transistor and said organic electroluminescent device, wherein said spacer layer is made up of a dual curing system which is achieved by two independent curing stages, one is an ultraviolet curing reaction, the other is a dark reaction, wherein said dual curing system is a curing system selected from the group consisting of:

a free radical ultraviolet curing-thermal curing system made of a material comprising:
- 30~40% unsaturated polyester resin or acrylic resin or polymercaptan-polyene;
- 35~45% epoxy resin or isocyanate or amino resin or free radical thermal curing agent;
- 0.2~3% styrene and its derivatives or single functional or poly-functional acrylic;
- 0.1~3% photoinitiator; and
- 0.2~6% photosensitizer and additive,
wherein a curing process is firstly ultraviolet curing, then heat curing, and lastly ultraviolet curing; or firstly heat curing, then ultraviolet curing, and lastly heat curing;

a free radical ultraviolet curing-microwave curing system made of a material comprising:
- 30~40% unsaturated polyester resin or acrylic resin or polymercaptan-polyene;
- 35~45% epoxy resin or isocyanate or amino resin or free radical thermal curing agent;
- 0.2~3% styrene and its derivatives or single functional or poly-functional acrylic;
- 0.1~3% photoinitiator; and
- 0.2~6% photosensitizer and additive,
wherein a curing process is firstly ultraviolet curing, then microwave curing, and lastly ultraviolet curing; or firstly microwave curing, then ultraviolet curing, and lastly heat or microwave curing;

a free radical ultraviolet curing-anaerobic curing system made of a material comprising:
- 55~65% unsaturated polyester resin or acrylic resin or polymercaptan-polyene;
- 20~30% dimethacrylate polyol ester or bisphenol-A epoxy polyol ester;
- 0.2~3% styrene and its derivatives or single functional or poly-functional acrylic;
- 0.1~3% photoinitiator; and
- 0.2~6% photosensitizer and additive,
wherein a curing process is firstly ultraviolet curing, then anaerobic curing automatically an adhesive without illumination and under hypoxic condition, and lastly ultraviolet curing;

to a free radical ultraviolet curing-electron beam curing system made of a material comprising:
- 35~40% unsaturated polyester resin or acrylic resin or polymercaptan-polyene;
- 50~55% bisphenol-A vinyl ester resin;
- 0.2~3% styrene and its derivatives or single functional or poly-functional acrylic;
- 0.1~3% photoinitiator; and
- 0.2~6% photosensitizer and additive,
wherein a curing process is firstly ultraviolet curing, then electron beam curing in the vacuum, and lastly ultraviolet curing;

a cationic ultraviolet curing-thermal curing system made of a material comprising:
- 35~45% epoxy resin or modified epoxy resin;
- 40~45% isocyanate or amino resin or free radical thermal curing agent;
- 4.0~9% diluting agent;
- 1.2~3% cationic photoinitiator; and
- 0.2~3% photosensitizer and additive, wherein a curing process is firstly ultraviolet curing, then heat curing, and lastly ultraviolet curing; or firstly heat curing, then ultraviolet curing, and lastly heat curing;

a cationic ultraviolet curing-microwave curing system made of a material comprising:
35~45% epoxy resin or modified epoxy resin;
40~45% isocyanate or amino resin or free radical thermal curing agent;
4.0~9% diluting agent;
1.2~3% cationic photoinitiator; and
0.2~3% photosensitizer and additive,
wherein a curing process is firstly ultraviolet curing, then microwave curing, and lastly ultraviolet curing; or firstly microwave curing, then ultraviolet curing, and lastly heat or microwave curing;

a cationic ultraviolet curing-anaerobic curing system made of a material comprising:
60~65% epoxy resin or modified epoxy resin;
25~30% dimethacrylate polyol ester or bisphenol-A epoxy polyol ester;
0.4~9% diluting agent;
0.1~3% cationic photoinitiator; and
0.2~3% photosensitizer and additive,
wherein a curing process is firstly ultraviolet curing, then anaerobic curing automatically an adhesive without illumination and under hypoxic condition, and lastly ultraviolet curing; and a cationic ultraviolet curing-electron beam curing system made of a material comprising:
30~35% epoxy resin or modified epoxy resin;
50~55% bisphenol-A vinyl ester resin;
0.4~6% diluting agent;
0.1~3% cationic photoinitiator; and
0.2~3% photosensitizer and additive,
wherein a curing process is firstly ultraviolet curing, then electron beam curing in the vacuum, and lastly ultraviolet curing.

2. The active matrix organic electroluminescent device, as recited in claim 1, wherein said free radical thermal curing agent comprises: ethylenediamine, hexamethylene diamine, triethylenetetramine, hydroxyethyl diethylene triamine, hydroxyl isopropyl diethylenetriamine, poly ethane diacid adipamide, dimethyl amino propyl amine, tetramethyl propanediamine, dicyandiamide, diaminodiphenylsulfone, diaminodiphenyl methane, m-phenylenediamine, diethyltoluenediamine, N-(aminopropyl)-toluene diamine, dimethylethanolamine, dimethyl benzyl amine, triethyl benzyl amine chloride, benzyl-dimethylamine, N-dimethyl benzyl amine, 2,4,6,-tri-(dimethylaminomethyl)-phenol, phenol-formaldehyde-hexanediamine, N,N-dimethyl benzyl amine, 2-ethylimidazole, 2-phenylimidazole, 2-methylimidazole, 2-ethylimidazole, 2-ethyl-4-methylimidazole, 1-(2-aminoethyl)-2-methylimidazole, maleic anhydride, diphenyl ether tetracid dianhydride, phthalic anhydride, trimellitic anhydride, tetrabromophthalic anhydride, polyazelaic acetic anhydride, sebacic dihydrazide, adipic dihydrazide, carbonic dihydrazide, oxalyl dihydrazide, succinic dihydrazide, adipoyl hydrazide, N-amino polyacrylamide, sebacic hydrazide, isophthalic hydrazide, dihydroxy benzoic acid hydrazide, azelaic acid dihydrazide, isophthalic dihydrazide, ferrocene tetrafluoborate, triallyl cyanurate, toluene diisocyanate, diphenyl-methane-diisocyanate, hexamethylene diisocyanate, trimethylhexamethylene diisocyanate, dicyclohexylmethane diisocyanate, xylyl diisocyanate, tetramethyl xylyl diisocyanate, methylstyrene isocyanate, methylcyclohexane diisocyanate, triphenylmethyl-4,4',4'-triisocyanate, diaminobiphenyl methane, N-chlorophenyl-N—N-dimethylurea, 3-phenyl-1,1-dimethylurea, 3-chlorophenyl-1,1-dimethylurea, 4,4'-diaminodiphenyl bisphenol, polyurethane, urea-formaldehyde resin, epoxy-ethylenediamine carbamate, 2,4,6-tris(dimethylaminomethyl)phenol, 2,4-diaminotoluene, polyurethane, methylated urea formaldehyde resin, tris(3-aminopropyl)amine, 2-aminoethyl-bis(3-aminopropyl)amine, 4,4'-diamino diphenyl methane, 4,4'-diamino diphenyl bisphenol, 4,4'-diamino diphenyl sulfone, tris(3-aminopropyl) amine, melamine resin, benzoguanamine resin, hexamethylol melamine resin, hexamethoxy methyl melamine resin, urea-melamine formaldehyde resin, polyester melamine, trichloro-isocyanurate, amino triazine resin, urethane acrylate, 4-aminopyridine resin, N-β-aminoethyl amino-polyester resin, α-aminopyridine resin, amino diphenyl ether resin, phosphoramidic resin, hydroxyethyl amino polyester resin, said microwave curing adhesive and thermal curing adhesive can be made of the same or different material, said anaerobic curing adhesive comprises tetraethylene glycol dimethacrylate, triethlene glycol bismethylacrylate, triethylene glycol di-methacrylate, glycol dimethacrylate, hydroxyethyl or hydroxypropyl methacrylate, methoxylated poly(ethylene glycol) methyl ether methacrylate, phthalic acid triethylene glycol ester, β-hydroxyethyl methacrylate, triethylene glycol dimethacrylate, dimethacryloyl-ethylthioether, phthalic bis(diethylene glycol acrylate), ethoxylated bisphenol A dimethacrylate, dimethyl acrylic bisphenol A ethylene glycol ester, ethylene methacrylic acid ester, triethylene glycol dimethacrylate, triethlene glycol bismethylacrylate, ethylene glycol bismethylacrylate, diethylene glycol bismethylacrylate, methacrylate epoxy resin, diethylene glycol dimethacrylate, said electron beam curing adhesive comprises tri (4-hydroxyphenyl)methane glycidyl ether epoxy resin, dicyclopentadiene bisphenol epoxy resin, bisphenol A vinyl ester resin, epoxy vinyl ester resin, epoxy acrylic resin, maleimide resin, 4,4'-diphenylmethane bismaleimide, bisphenol A-diphenyl ether bismaleimide, bisphenol A maleicethenyl resin, brominated vinyl ester resin, phenolic epoxy ethenyl resin, hydroxymetyyl bisphenol A epoxy ether, bisphenol A acrylic ester, polyurethane-acrylate, bisphenol A epoxy vinyl ester resin, bisphenol A benzoxazine-epoxy resin, bisphenol fluorine epoxy resin, bisphenol A epoxy acrylic resin, bisphenol A diglycidyl ether, and bisphenol A epoxy chloric acrylic ester resin.

3. The active matrix organic electroluminescent device, as recited in claim 1, wherein said photoinitiator comprises benzoin and its derivates benzoin methyl ether, benzoin ethyl ether, acetyl benzene derivates and benzoin isopropyl ether, said cationic photoinitiator comprises aryl sulfonium salt, iodonium salt, and ferrocenium salt, said photo sensitizer comprises benzophenone, thia-anthraquinone and michler's ketone, said additive comprises plasticizer, thixotropic agent and filler.

4. The active matrix organic electroluminescent device, as recited in claim 3, wherein said plasticizer comprises phthalic acid bis-1-octyl ester, phthalic acid bis-butyl ester, tris(2-butoxyethyl) phosphate, polyvinyl butyral resin, acetyl tri-n-butyl citrate, dimethyl phthalate, diethyl phthalate, hexanedioic acid bis(butoxyethoxy)ethyl ester, tetraisopropyl titanate, tetrabutyl titanate, citric acid ester, 2-ethylhexyl trimellitate, phthalic acid bis-2-ethylhexyl ester, diisooctyl sebacate, diethylene glycol dibenzoate, phthalic anhydride, dipropylene glycol dibenzoate, and chlorosulfonated polyethylene, said coupling agent comprises vinyl methyldichloro silane, methyldichlorosilane, dimethyldichlorosilane, dimethylchlorosilane, vinyltrichloro silane, 3-aminopropyltrimethoxysilane, polydimethylsiloxane, polymethylhydrosiloxane, polymethylmethoxylsiloxane, 3-glycidoxypropyltrimethoxysilane, 3-aminopropyltriethoxysilane, γ-glycidicether propyl trimethoxysilane, aminopropyltriethyoxysilane, 3-glycidoxypropyltrimethoxysilane, dodecyl-trimethoxysilane, ethenyltriethyloxysilane, vinyltrimethoxysilane, 3-chloropropyltriethoxysilane, bis-(triethoxysilylpropyl), anilinomethyl-triethoxysliane, N-(β-aminoethyl)-γ-aminopropyltrimethoxy silane, N-(β-Aminoethyl)-γ-aminopropyltriethoxy silane, N-(β-(aminoethyl))-γ-aminopropyl-methyldimethoxy silane, 3-methacryloxypropyltrimethoxysilane, γ-methacryloxypropyltrimethylsilane, (3-mercaptopropyl) trimethoxysilane, and 3-mercaptopropyltriethoxysilane.

* * * * *